US012578362B2

(12) United States Patent
Bak et al.

(10) Patent No.: US 12,578,362 B2
(45) Date of Patent: Mar. 17, 2026

(54) TEST DEVICES AND SYSTEMS THAT UTILIZE EFFICIENT TEST ALGORITHMS TO EVALUATE DEVICES UNDER TEST

(71) Applicant: Samsung Electronics Co., Ltd., Suwon-si (KR)

(72) Inventors: Jungmin Bak, Suwon-si (KR); Junyoung Ko, Suwon-si (KR); Changhwi Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 240 days.

(21) Appl. No.: 18/166,656

(22) Filed: Feb. 9, 2023

(65) Prior Publication Data

US 2023/0408554 A1 Dec. 21, 2023

(30) Foreign Application Priority Data

Sep. 15, 2022 (KR) ......................... 10-2022-0116650

(51) Int. Cl.
*G01R 19/00* (2006.01)
*G01R 19/165* (2006.01)
*G11C 29/50* (2006.01)

(52) U.S. Cl.
CPC ... *G01R 19/0038* (2013.01); *G01R 19/16552* (2013.01); *G11C 29/50004* (2013.01);
(Continued)

(58) Field of Classification Search
CPC .......... G01R 19/0038; G01R 19/16552; G11C 29/50004; G11C 2029/5004; G11C 29/50;
(Continued)

(56) References Cited

U.S. PATENT DOCUMENTS

| 6,721,910 B2 | 4/2004 | Ninomiya et al. |
| 7,362,634 B2 | 4/2008 | Kwak |

(Continued)

FOREIGN PATENT DOCUMENTS

| KR | 101241287 B1 | 3/2013 |

OTHER PUBLICATIONS

Prasad et al. "Process Variation Analysis of 10T SRAM Cell for Low Power, High Speed Cache Memory for IoT Applications" 2020 7th International Conference on Signal Processing and Integrated Networks (SPIN) (Feb. 2020).
(Continued)

*Primary Examiner* — Raul J Rios Russo
(74) *Attorney, Agent, or Firm* — Wolf, Greenfield & Sacks, P.C.

(57) ABSTRACT

A test device includes a power supply circuit that is configured to supply an input voltage through a power voltage pin to a memory device under test, and a test controller, which is configured to: (i) transmit a command signal to the memory device, (ii) measure a first current flowing to the memory device through the power voltage pin at a first time point after transmitting the command signal, (iii) measure a second current flowing to the memory device through the power voltage pin at a second time point, which is different from the first time point, and (iv) compare the measured first current to the measured second current to thereby determine whether the memory device has a defect therein.

18 Claims, 9 Drawing Sheets

100

(52) U.S. Cl.
CPC ................ *G11C 2029/5004* (2013.01); *G11C 2029/5006* (2013.01)

(58) Field of Classification Search
CPC .............. G11C 29/56; G11C 29/12005; G11C 2029/5006
USPC ................................................... 324/762.01
See application file for complete search history.

(56) References Cited

U.S. PATENT DOCUMENTS

| | | | |
|---|---|---|---|
| 7,450,458 B2 | 11/2008 | Mori et al. | |
| 9,633,746 B2 | 4/2017 | Kim et al. | |
| 9,726,724 B2 | 8/2017 | Xu et al. | |
| 10,566,073 B2 | 2/2020 | Jung | |
| 2006/0123301 A1* | 6/2006 | Wey | G01R 31/31924 |
| | | | 714/742 |
| 2006/0203590 A1 | 9/2006 | Mori et al. | |
| 2009/0287972 A1* | 11/2009 | Lee | G11C 29/48 |
| | | | 714/E11.177 |
| 2010/0054061 A1* | 3/2010 | Park | G11C 29/40 |
| | | | 365/207 |
| 2014/0006886 A1 | 1/2014 | Song | |
| 2014/0043903 A1* | 2/2014 | Ok | G11C 29/028 |
| | | | 365/185.09 |
| 2015/0154095 A1* | 6/2015 | Kang | G11C 29/44 |
| | | | 714/733 |
| 2017/0040067 A1* | 2/2017 | Byun | G11C 17/16 |
| 2020/0035272 A1* | 1/2020 | Nakaoka | G11C 29/026 |
| 2022/0293203 A1* | 9/2022 | Troia | G11C 5/143 |

OTHER PUBLICATIONS

Ting et al. "23.9 An 8-channel 4.5Gb 180GB/s 18ns-row-latency RAM for the last level cache" 2017 IEEE International Solid-State Circuits Conference (ISSCC) (Feb. 2017).

* cited by examiner

Figure 1:
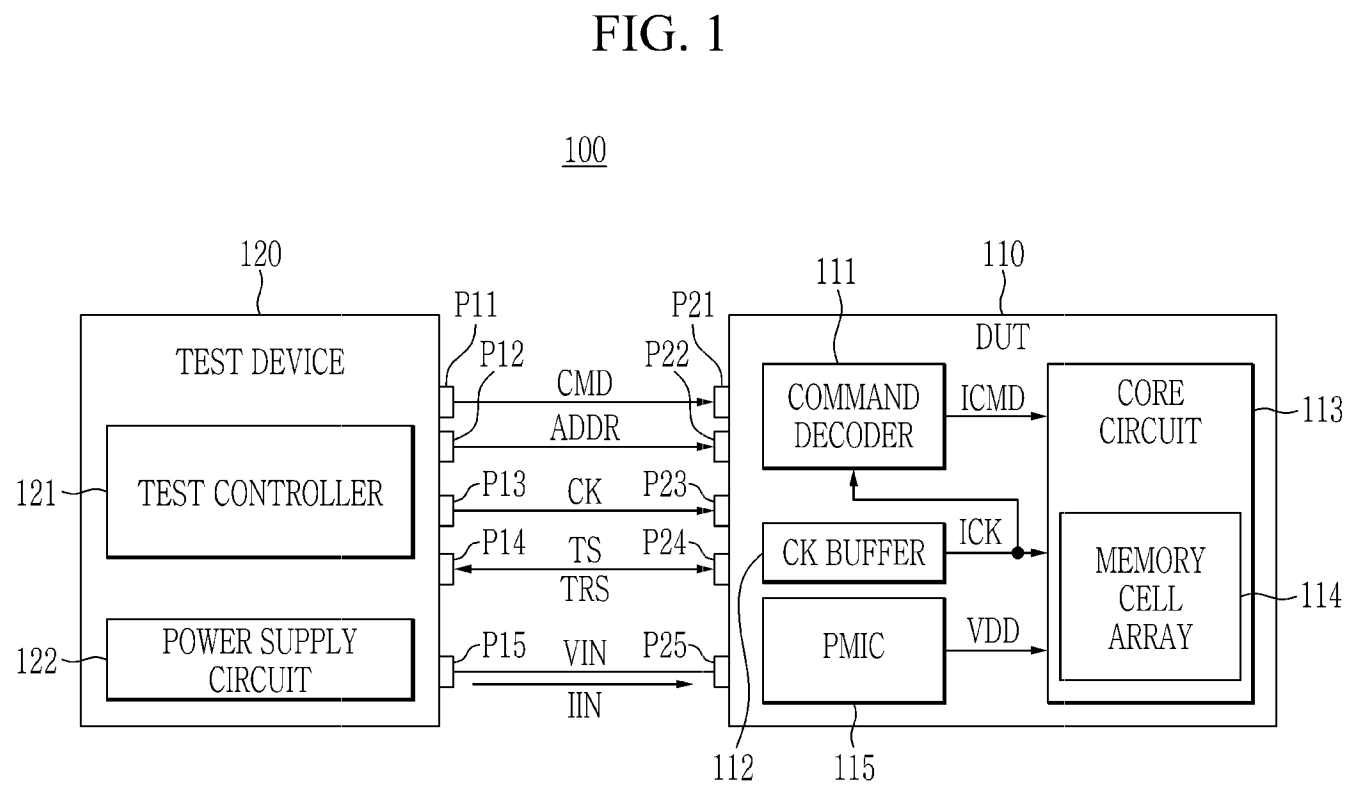

TEST DEVICE

121 — TEST CONTROLLER

122 — POWER SUPPLY CIRCUIT

P11
P12 — CMD
ADDR
P13 — CK
P14 — TS
TRS
P15 — VIN
IIN

P21
P22
P23
P24
P25

110
DUT

111 — COMMAND DECODER
ICMD

112 — CK BUFFER
ICK

115 — PMIC
VDD

113 — CORE CIRCUIT

114 — MEMORY CELL ARRAY

TEST DEVICES AND SYSTEMS THAT UTILIZE EFFICIENT TEST ALGORITHMS TO EVALUATE DEVICES UNDER TEST

CROSS-REFERENCE TO RELATED APPLICATIONS

This application claims priority to Korean Patent Application No. 10-2022-0075831, filed in the Korean Intellectual Property Office on Jun. 21, 2022, and Korean Patent Application No. 10-2022-0116650, filed in the Korean Intellectual Property Office on Sep. 15, 2022, the entire contents of which are hereby incorporated herein by reference.

BACKGROUND

(a) Field

One or more embodiments of the present disclosure relates to test devices and test systems for testing integrated circuit devices.

(b) Description of the Related Art

Recently, there has been increasing demand for using a DRAM (Dynamic Random Access Memory) as a last-level cache (LLC). An SRAM (Static Random Access Memory) interface has been generally used as an LLC in the existing system. However, to use a DRAM as an LLC, because a command of the SRAM interface is different from a command of the DRAM, an internal command of the DRAM may be additionally generated according to the command of the SRAM interface, and the DRAM may then be operable as the LLC. To support this substitution with a DRAM in an LLC application, a method for testing whether or not the DRAM is normally operated according to the SRAM interface command is required.

SUMMARY

One or more embodiments of the disclosure may provide a test device and a test system for detecting whether an internal command of a memory device is normally generated.

One or more embodiments of the disclosure provide a test device including a power supply circuit for supplying an input voltage to a memory device via a power voltage pin, and a test controller, which is configured to: (i) transmit a command signal to the memory device, (ii) compare a first current flowing to the memory device through the power voltage pin at a first time after transmitting the command signal, to a second current flowing to the memory device through the power voltage pin at a second time, which is different from the first time, and (iii) determine whether the memory device has a defect based on the comparison.

The test controller may determine that the memory device has a defect therein when the first current is substantially equivalent to the second current, and the test controller may determine the memory device to be normal when the first current is different from the second current. The first time may be in a time interval during which the memory device performs a first operation according to the command signal, and the second time may be in a time interval during which the memory device performs a second operation according to the command signal.

The test controller may also transmit a clock signal to the memory device, and the first time and the second time may be synchronized with the clock signal. In some embodiments, the first time may be an edge of the clock signal before the memory device performs a second operation according to the command signal, and the second time may be an edge of the clock signal after the memory device starts performing the second operation according to the command signal.

The test device may further include a current measurer configured to measure a current flowing to the memory device through the power voltage pin. In particular, the test controller may measure the first current and the second current through the current measurer. According to some embodiments, the test controller may stop applying the clock signal at the first time, and the current measurer may measure the first current while the applying of the clock signal is stopped. Likewise, the test controller may stop applying the clock signal at the second time, and the current measurer may measure the second current while the applying of the clock signal is stopped.

In some embodiments, the command signal may be a write with auto-precharge instruction, the first operation may be a write operation, and the second operation may be a precharge operation. Also, the command signal may be a write instruction, and the first operation may be an active operation and the second operation may be a write operation. Alternatively, the first operation may be the write operation and the second operation may be a precharge operation. The command signal may also be a command signal that is compatible with an SRAM interface.

According to another embodiment, a testing method is provided, which includes: (i) supplying an input voltage to a memory device through a power voltage pin, (ii) transmitting a command signal to the memory device, (iii) measuring a first current flowing to the memory device through the power voltage pin at a first time after transmitting the command signal, (iv) measuring a second current flowing to the memory device through the power voltage pin at a second time, which is different from the first time, and (v) comparing the first current to the second current and determining whether the memory device has a defect based on the comparison.

The operations of determining whether the memory device has a defect may include determining that the memory device has a defect when the first current is substantially equivalent to the second current, and determining the memory device to be normal when the first current is different from the second current. In addition, the first time may be in a period during which the memory device performs a first operation according to the command signal, and the second time may be in a period during which the memory device performs a second operation according to the command signal.

The testing method may further include transmitting a clock signal to the memory device, and the first time and the second time may be synchronized with the clock signal. In particular, the first time may be an edge of the clock signal before the memory device performs a second operation according to the command signal, and the second time may be an edge of the clock signal after the memory device starts performing the second operation according to the command signal.

The operations of measuring a first current may include suspending application of the clock signal at the first time, and measuring the first current while the clock signal is suspended. And, the operations of measuring a second current may include suspending application of the clock signal at the second time, and measuring the second current while applying the clock signal is suspended.

In some embodiments, the command signal may be a write with auto-precharge instruction, the first operation may be a write operation, and the second operation may be a precharge operation. In other embodiments, the command signal may be a write instruction, and the first operation may be an active operation and the second operation may be a write operation. Alternatively, the first operation may be the write operation and the second operation may be a precharge operation.

The first time and the second time may occur in a time interval before the memory device performs a second operation after performing a first operation according to the command signal. In addition, the comparing of the first current and the second current, and determining of whether the memory device has a defect may include determining that the memory device has a defect when the first current is substantially equivalent to the second current, and determining the memory device to be normal when the first current is sufficiently different from the second current.

Another embodiment of the present disclosure provides a test system including a device under test (including a semiconductor memory device therein), and a test device, which is configured to: (i) supply an input voltage to the device under test, (ii) generate a command signal for allowing the device under test to perform a first operation and a second operation, (iii) transmit the command signal to the memory device, (iv) measure a current flowing to the device under test when performing the first operation as a first current, (v) measure a current flowing to the device under test when performing the second operation as a second current, (vi) compare the first current to the second current, and (vii) determine whether the device under test has a defect based on the comparison.

BRIEF DESCRIPTION OF THE DRAWINGS

FIG. 1 shows a block diagram of a test system according to an embodiment.

FIG. 3 shows a block diagram of a test device according to an embodiment.

FIG. 5 shows a timing diagram of internal commands and signals relating to a write command applied to a semiconductor memory device according to an embodiment.

FIG. 6 shows a timing diagram of internal commands and signals relating to a write command applied to a semiconductor memory device according to an embodiment.

FIG. 7 shows a timing diagram of internal commands and signals relating to a read command applied to a semiconductor memory device according to an embodiment.

DETAILED DESCRIPTION OF THE EMBODIMENTS

Figure 2:
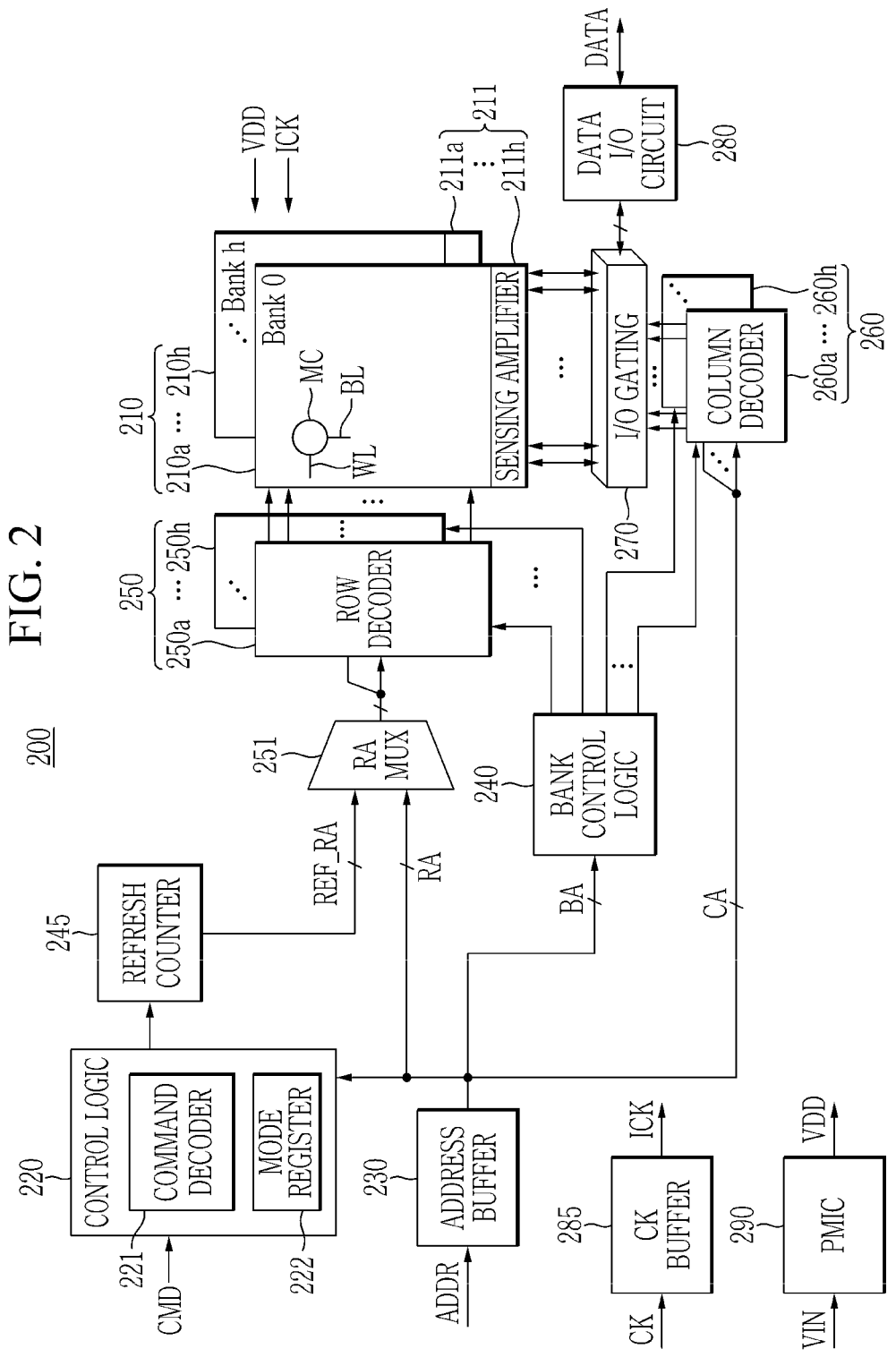
FIG. 2 shows a block diagram of a semiconductor memory device according to an embodiment.

In the following detailed description, only certain embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. In the flowcharts described with reference to the drawings in this specification, the operation order may be changed, various operations may be merged, certain operations may be divided, and certain operations may be omitted.

An expression recited in the singular may be construed as singular or plural unless the expression "one", "single", etc., is used. Terms including ordinal numbers such as first, second, and the like, will be used only to describe various components, and are not to be interpreted as limiting these components. The terms may be only used to differentiate one component from others FIG. 1 shows a block diagram of a test system according to an embodiment. Referring to FIG. 1, the test system 100 includes a device under test (DUT) 110 and a test device 120. The device under test 110 may include a command decoder 111, a clock buffer 112, a core circuit 113, a memory cell array 114, and a power management integrated circuit PMIC 115.

The command decoder 111 may receive a command signal CMD from the test device 120. The command decoder 111 may decode the command signal CMD to generate an internal command signal ICMD. The command decoder 111 may generate the internal command signal ICMD in response to an internal clock signal ICK provided by the clock buffer 112.

The command decoder 111 may provide the internal command signal ICMD to the core circuit 113. The internal command signal ICMD may control an operation performed by the core circuit 113. The clock buffer 112 may receive a clock signal CK from the test device 120. The clock buffer 112 may buffer the clock signal CK to generate the internal clock signal ICK, and provide the internal clock signal ICK to the command decoder 111 and the core circuit 113. A phase of the internal clock signal ICK may/may not be equivalent to the phase of the clock signal CK.

The core circuit 113 may include the memory cell array 114. The core circuit 113 may read data from the memory cell array 114 in response to a read instruction and the internal clock signal ICK at a read operation of the device under test 110. The core circuit 113 may write data to the memory cell array 114 in response to a write instruction and the internal clock signal ICK at a write operation of the device under test 110. A more detailed configuration of the core circuit 113 will be described in a later portion of the present specification with reference to FIG. 2.

The power management integrated circuit 115 may generate a power source voltage VDD based on an input voltage VIN, and may provide the generated power source voltage VDD to respective elements of the device under test 110. For example, the core circuit 113 is operable based on the power source voltage VDD. The device under test 110 may be a semiconductor memory device such as the DRAM (Dynamic Random Access Memory). However, the embodiments of the present disclosure is not limited thereto, and the device under test 110 may be an arbitrary semiconductor device for performing the write operation and the read operation.

The test device 120 may be electrically connected to the device under test 110. In an embodiment, a command pin P11, an address pin P12, a clock pin P13, a data pin P14, and a power voltage pin P15 of the test device 120 may be connected to a command pin P21, an address pin P22, a clock pin P23, a data pin P24, and a power voltage pin P25 of the device under test 110, respectively.

The test device 120 may include a test controller 121 and a power supply circuit 122. The test controller 121 may generate a command signal CMD, an address ADDR, a clock signal CK, and a test signal TS. The test device 120 may provide the command signal CMD to the device under test 110 through the command pins P11 and P21, and may provide the address ADDR to the device under test 110 through the address pins P12 and P22, and may provide the clock signal CLK to the device under test 110 through the clock pins P13 and P23. The test device 120 may control a test operation on the device under test 110 by using the command signal CMD, the address ADDR, and the clock signal CLK. The device under test 110 may provide a test result signal TRS corresponding to the test data signal TS to the test device 120 via data pins P14 and P24.

In an embodiment, the test device 120 may provide the test command signal CMD, the test address ADDR, and the test signal TS to the device under test 110. The device under test 110 may generate a plurality of internal command signals ICMD according to the test command signal CMD, and may provide the same to the core circuit 113 to thus perform an operation corresponding to the test command signal CMD. An order and timing for generating a plurality of internal command signals ICMD may be preset.

For example, the test command signal CMD may be a write-auto precharge instruction. In this case, the device under test 110 may sequentially generate a write instruction and a precharge instruction as internal command signals ICMD according to the write-auto precharge instruction. The device under test 110 may write the data included in the test signal TS to a region indicated by the test address ADDR in the memory cell array 114 by providing the write instruction to the core circuit 113. The device under test 110 may perform a precharge operation by providing a precharge instruction to the core circuit 113.

For another example, the test command signal CMD may be a read-auto precharge instruction. In this case, the device under test 110 may sequentially generate a read instruction and a precharge instruction as internal command signals ICMD according to a read-auto precharge instruction. The device under test 110 may read data from the region indicated by the test address ADDR in the memory cell array 114 and may generate a test result signal TRS by providing a read instruction to the core circuit 113, and may provide the test result signal TRS to the test device 120. The device under test 110 may perform the precharge operation by providing the precharge instruction to the core circuit 113.

For another example, the test command signal CMD may be a write instruction. In this case, the device under test 110 may sequentially generate an active instruction, a write instruction, and a precharge instruction as internal command signals ICMD according to the write instruction. The device under test 110 may select a row to be activated, indicated by the test address ADDR in the memory cell array 114 by providing an active instruction to the core circuit 113. The device under test 110 may write the data included in the test signal TS to the region indicated by the test address ADDR in the memory cell array 114 by providing the write instruction to the core circuit 113. The device under test 110 may perform a precharge operation by providing the precharge instruction to the core circuit 113.

For another example, the test command signal CMD may be a read instruction. In this case, the device under test 110 may sequentially generate an active instruction, a read instruction, and a precharge instruction as internal command signals ICMD according to the read instruction. The device under test 110 may select the row to be activated, indicated by the test address ADDR in the memory cell array 114 by providing the active instruction to the core circuit 113. The device under test 110 may read data from the region indicated by the test address ADDR in the memory cell array 114 and may generate a test result signal TRS by providing the read instruction to the core circuit 113, and may provide the test result signal TRS to the test device 120. The device under test 110 may perform a precharge operation by providing the precharge instruction to the core circuit 113.

The power supply circuit 122 may generate an input voltage VIN. The power supply circuit 122 may provide the input voltage VIN to the device under test 110. The test device 120 may provide the input voltage VIN to the device under test 110 through the power voltage pins P15 and P25. The device under test 110 may perform different operations (e.g., active, write, read, refresh, precharge, and a mode setting) according to the command signal CMD by using the input voltage VIN. The current IIN provided to the device under test 110 from the test device 120 may be changed according to an operation performed by the device under test 110. The test device 120 may measure the current IIN provided to the device under test 110. The test device 120 may measure the current IIN flowing through the power voltage pins P15 and P25. The test device 120 may measure the current IIN after providing the command signal CMD. The test device 120 may measure the current IIN when a predetermined period passes after providing the command signal CMD. The test device 120 may measure the current IIN in synchronization with the clock signal CK after providing the command signal CMD. The test device 120 may measure the current IIN when at least one period of the clock signal CK passes after providing the command signal CMD. The test device 120 may stop applying the clock signal CK and may measure the current IIN after providing the command signal CMD. The test device 120 may stop applying the command signal CMD, and may measure the current IIN in synchronization with the clock signal CK after providing the clock signal CK.

The test device 120 may measure the current IIN at a first time after providing the command signal CMD. The test device 120 may measure the current IIN in synchronization with the clock signal CK. The test device 120 may determine whether the device under test 110 has a defect based on the current IIN that is measured once. In an embodiment, the test device 120 may determine whether the device under test 110 has a defect according to whether the current IIN measured at the first time after applying the command signal CMD is within a reference current range. In detail, the test device 120 may determine the device under test 110 to be normal when the current IIN measured at the first time is within the reference current range. The test device 120 may determine that the device under test 110 has a defect when the current IIN measured at the first time is out of the reference current range. For example, the test device 120 may measure the current IIN when a predetermined period passes after providing a write-auto precharge instruction. According to the write-auto precharge instruction, the device under test 110 may sequentially provide the write instruction and the precharge instruction as the internal command signals ICMD to the core circuit 113. The test device 120 may determine the reference current range based on the current IIN measured after the time that is set for the device under test 110 to provide the write instruction to the core circuit 113. The test device 120 may measure the current IIN at the first time when the clock signal CK is transitioned to a high level before the time for the device under test 110 to provide the precharge instruction to the core circuit 113. The test device 120 may determine that a defect is generated to the device under test 110 when the current IIN is out of the reference current range at the first time. The test device 120 may determine that the device under test 110 is normal when the current IIN is within the reference current range at the first time.

The test device 120 may measure the current IIN at the first time and the second time after providing the command signal CMD. The test device 120 may measure current IIN multiple times in synchronization with the clock signal CK. In an embodiment, the test device 120 may measure the current IIN at a first edge and a second edge of the clock signal CK after providing the command signal CMD. The first edge of the clock signal CK may be positioned in the period for which the device under test 110 performs a first operation according to the command signal CMD, and the second edge of the clock signal CK may be positioned in the period for which the device under test 110 performs a second operation according to the command signal CMD.

The test device 120 may determine whether the device under test 110 has a defect based on the current IIN that is measured multiple times. In an embodiment, the test device 120 may determine whether the device under test 110 has a defect based on a change between the current IIN measured at the first time after applying the command signal CMD and the current IIN measured at the second time after the first time. In detail, the test device 120 may determine that the defect is generated to the device under test 110 when the current IIN measured at the first time is substantially equivalent to the current IIN measured at the second time. The test device 120 may determine the device under test 110 to be normal when the current IIN measured at the first time is different from the current IIN measured at the second time. For example, the test device 120 may determine the device under test 110 to be abnormal when a size difference between the current IIN measured at the first time and the current IIN measured at the second time is less than a reference value. In contrast, when the size difference between the current IIN measured at the first time and the current IIN measured at the second time is equal to or greater than a reference value, the test device 120 may determine the device under test 110 to be normal. That the current IIN measured at the first time is substantially equivalent to the current IIN measured at the second time signifies that the difference between the current IIN measured at the first time and the current IIN measured at the second time is less than the reference value, and that the current IIN measured at the first time is different from the current IIN measured at the second time signifies that the difference between the current IIN measured at the first time and the current IIN measured at the second time is greater than the reference value.

For example, the test device 120 may measure the current IIN when a predetermined period passes from the time when a write-auto precharge instruction is provided. The test device 120 may measure the current IIN at the first time when the clock signal CK is transitioned to the high level before the time when the device under test 110 is set to provide the precharge instruction to the core circuit 113 as an internal command signal ICMD according to the write-auto precharge instruction. The test device 120 may measure the current IIN at the second time when the device under test 110 is set to provide the precharge instruction to the core circuit 113 as the internal command signal ICMD. The test device 120 may determine that a defect is generated to the device under test 110 when the current IIN at the first time is equivalent to the current IIN at the second time. The test device 120 may determine the device under test 110 to be normal when the current IIN measured at the first time is different from the current IIN measured at the second time.

For another example, the test device 120 may measure the current IIN when a predetermined period passes from the time when the read-auto precharge instruction is provided. The test device 120 may measure the current IIN at the first time when the clock signal CK is transitioned to the high level before the time when the device under test 110 is set to provide the precharge instruction to the core circuit 113 as the internal command signal ICMD according to the read-auto precharge instruction. The test device 120 may measure the current IIN at the second time when the device under test 110 is set to provide the precharge instruction to the core circuit 113 as the internal command signal ICMD. The test device 120 may determine that a defect is generated to the device under test 110 when the current IIN measured at the first time is equivalent to the current IIN measured at the second time. The test device 120 may determine the device under test 110 to be normal when the current IIN measured at the first time is different from the current IIN measured at the second time.

For another example, the test device 120 may measure the current IIN when a predetermined period passes from the time when the write instruction (or read instruction) is provided. The test device 120 may measure the current IIN at the first time when the clock signal CK is transitioned to the high level before the respective times when the device under test 110 is set to provide the active instruction, the write instruction (or read instruction), and the precharge instruction to the core circuit 113 to the internal command signal ICMD according to the write instruction. The test device 120 may measure the current IIN at the respective second times when the device under test 110 is set to provide the active instruction, the write instruction, and the precharge instruction to the core circuit 113 as the internal command signal ICMD. The test device 120 may determine that a defect is generated to the device under test 110 when the current IIN at the first time before the time when the active instruction is set to be provided to the core circuit 113 as the internal command signal ICMD is equivalent to the current IIN at the second time when the active instruction is set to be provided to the core circuit 113 as the internal command signal ICMD, and the test device 120 may determine the device under test 110 to be normal in other cases. The test device 120 may determine that a defect is generated to the device under test 110 when the current IIN at the first time before the time when the write instruction (or read instruction) is set to be provided to the core circuit 113 as the internal command signal ICMD is equivalent to the current IIN at the second time when the active instruction is set to be provided to the core circuit 113 as the internal command signal ICMD, and the test device 120 may determine the device under test 110 to be normal in other cases. The test device 120 may determine that a defect is generated to the device under test 110 when the current IIN at the first time before the same when the precharge instruction is set to be provided to the core circuit 113 as the internal command signal ICMD is equivalent to the current IIN at the second time when the active instruction is set to be provided to the core circuit 113 as the internal command signal ICMD, and the test device 120 may determine the device under test 110 to be normal in other cases.

As described above, regarding the test system 100, the test device 120 may transmit the command signal CMD, may measure the currents IIN measured at the first time and the second time after a predetermined period passes, and may detect whether the device under test 110 normally generates the internal command signal ICMD. That is, according to an embodiment, when transmitting the command signal CMD of the SRAM interface to the device under test 110, the test device 120 may determine whether the internal command signal ICMD of the device under test 110 according to the command signal CMD is generated at appropriate timing.

FIG. 1 shows that one device under test 110 is connected to the test device 120, but the embodiments of the present disclosure are not limited thereto, and a plurality of devices under test 110 may be connected to the test device 120. In this case, the test device 120 may simultaneously or sequentially perform a test operation on the devices under test 110.

FIG. 2 shows a block diagram of a semiconductor memory device according to an embodiment. Referring to FIG. 2, the semiconductor memory device 200 includes a memory cell array 210, a sensing amplifier 211, a control logic circuit 220, an address buffer 230, a refresh counter 245, a bank control logic 240, a row decoder 250, a column decoder 260, an I/O gating circuit 270, a data I/O circuit 280, a clock buffer 285, and a power management integrated circuit 290.

The memory cell array 210 includes a plurality of memory cells MC. In an embodiment, the memory cell array 210 may include a plurality of memory banks 210a to 210h. FIG. 2 shows eight memory banks BANK0 to BANK7 or 210a to 210h, and the number of the memory banks is not limited thereto. The respective memory banks 210a to 210h may include a plurality of rows, a plurality of columns, and a plurality of memory cells MC arranged at crossing points of the rows and the columns. In an embodiment, the rows may be defined by a plurality of word lines WL, and the columns may be defined by a plurality of bit lines BL.

The control logic circuit 220 controls an operation of the memory device 200. For example, the control logic circuit 220 may generate control signals so that the memory device 200 may perform a read operation, a write operation, and an offset calibration operation. In an embodiment, the control logic circuit 220 may include an instruction decoder 221. The instruction decoder 221 may decode the instruction CMD provided by a memory controller (e.g., 120 of FIG. 1) and may generate a control signal. In an embodiment, the control logic circuit 220 may further include a mode register 222 for setting an operation mode of the memory device 200.

The address buffer 230 receives an address ADDR from the memory controller 110. The address ADDR includes a row address RA for indicating a row of the memory cell array 210 and a column address CA for indicating a column. The row address RA is provided to the row decoder 250, and the column address CA is provided to the column decoder 260. In an embodiment, the row address RA may be provided to the row decoder 250 through the row address multiplexer 251. In an embodiment, the address ADDR may further include a bank address BA for indicating a memory bank. The bank address BA may be provided to the bank control logic 240.

In an embodiment, the memory device 200 may further include the bank control logic 240 for generating a bank control signal in response to the bank address BA. The bank control logic 240 may, in response to the bank control signal, activate the row decoder 250 corresponding to the bank address BA from among a plurality of row decoders 250, and activate the column decoder 260 corresponding to the bank address BA from among a plurality of column decoders 260.

In an embodiment, the memory device 200 may further include a row address multiplexer 251. The row address multiplexer 251 may receive a row address RA from the address buffer 230, and may receive a row address REF_RA to be refreshed from the refresh counter 235. The row address multiplexer 251 may selectively output the row address RA received from the address buffer 230 and the row address REF_RA received from the refresh counter 235 to the row decoder 250.

The row decoder 250 selects the row to be activated from among a plurality of rows of the memory cell array 210 based on the row address. To achieve this, the row decoder 250 may generate a driving voltage by using a power source voltage VDD. The row decoder 250 may apply the driving voltage to the word line corresponding to the row to be activated. In an embodiment, a plurality of corresponding row decoders 250a to 250h may be provided to a plurality of memory banks 210a to 210h.

The column decoder 260 selects the column to be activated from among a plurality of columns of the memory cell array 210 based on the column address. To achieve this, the column decoder 260 may activate the sensing amplifier 211 corresponding to the column address CA through the I/O gating circuit 270. In an embodiment, a plurality of corresponding column decoders 260a to 260h may be provided to a plurality of memory banks 210a to 210h. In an embodiment, the I/O gating circuit 270 may gate input/output data, and may include a data latch for storing the data read from the memory cell array 210 and a write driver for writing data to the memory cell array 210. The data read by the memory cell array 210 may be sensed by the sensing amplifier 211, and may be stored in the I/O gating circuit 270 (e.g., the data latch). In an embodiment, a plurality of corresponding sensing amplifiers 211a to 211h may be provided to a plurality of memory banks 210a to 210h.

In an embodiment, the data (e.g., data stored in the data latch) read by the memory cell array 210 may be provided to the memory controller 110 through the data I/O circuit 280. The data to be written on the memory cell array 210 may be provided to the data I/O circuit 280 from the memory controller 110, and the data provided to the data I/O circuit 280 may be provided to the I/O gating circuit 270.

The clock buffer 285 may generate the internal clock signal ICK by buffering the clock signal CK. A phase of the buffered internal clock signal ICK may be substantially equivalent to a phase of the clock signal CK. In an embodiment, the clock buffer 285 may generate the internal clock signal ICK by dividing the clock signal CK.

The power management integrated circuit 290 may generate a power source voltage VDD based on the input voltage VIN, and may provide the power source voltage VDD to respective elements of the semiconductor memory device 200. For example, the row decoder 250 may provide the driving voltage to the word line WL by using the power source voltage VDD.

Figure 3:
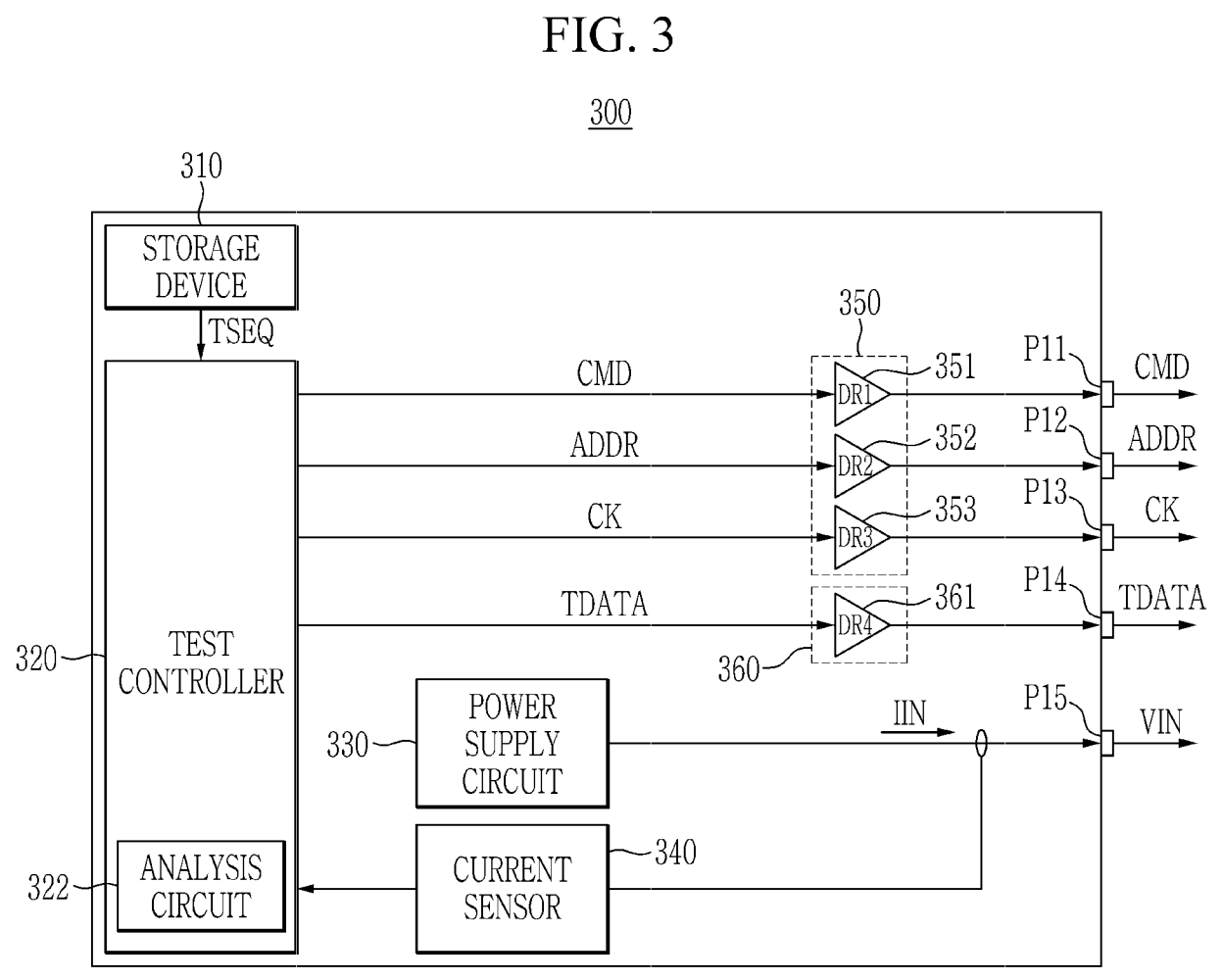

FIG. 3 shows a block diagram of a test device 300 according to an embodiment. Referring to FIG. 3, the test device 300 may include a storage device 310, a test controller 320, a power supply circuit 330, a current sensor 340, a drive channel 350, and an input and output channel 360. The storage device 310 may store a test sequence TSEQ for performing a test operation on the device under test 200 of FIG. 2. In an embodiment, the storage device 310 may include a non-volatile memory device such as a flash memory.

The test controller 320 may provide a command signal CMD, an address ADDR, and a clock signal CK to the drive channel 350, and the drive channel 350 may provide a command signal CMD, an address ADDR, and a clock signal CK to the device under test 200. In an embodiment, the drive channel 350 may include a command driver DR1 or 351, an address driver DR2 or 352, and a clock driver DR3 or 353. The command driver 351 may provide the command signal CMD received from the test controller 320 to the device under test 200 through the command pin P11. The address driver 352 may provide the address ADDR received from the test controller 320 to the device under test 200 through the address pin P12. The clock driver 353 may provide the clock signal CK received from the test controller 320 to the device under test 200 through the clock pin P13.

In an embodiment, the test controller 320 may read the test sequence TSEQ from the storage device 310, and may distinguish the test sequence TSEQ by n bits (n is a positive number) and may generate test data TDATA. The test controller 320 may provide the test data TDATA to the data driver DR4 or 361. The data driver 361 may output the test data DATA to the device under test 200 through the data pin P14. The power supply circuit 330 may generate an input voltage VIN. The input voltage VIN may be used to operate the device under test. The power supply circuit 330 may output the input voltage VIN to the device under test 200 through the power voltage pin P15.

The current sensor 340 may measure the current IIN flowing through the device under test 200 through the power voltage pin P15. The test controller 320 provides the command signal CMD to the device under test 200, and the current sensor 340 may then measure the current IIN. The current sensor 340 may measure the current IIN when the test controller 320 provides the command signal CMD and a predetermined period passes. The current sensor 340 may measure the current IIN multiple times in synchronization with the clock signal CK. In an embodiment, the current sensor 340 may measure the current IIN when the test controller 320 provides the command signal CMD and at least one period of the clock signal CK passes. When the test controller 320 provides the command signal CMD, the current sensor 340 may measure the current IIN in synchronization with the clock signal CK. When the test controller 320 provides the command signal CMD and stops applying the clock signal CK, the current sensor 340 may measure the current IIN. When the test controller 320 provides the command signal CMD and stops applying the clock signal CK, the current sensor 340 may measure the current IIN in synchronization with the clock signal CK.

The analysis circuit 322 may determine whether the device under test 200 has a defect based on the current IIN measured multiple times. The analysis circuit 322 may determine whether the device under test 200 has a defect based on the change between the current IIN measured at the first time after applying the command signal CMD and the current IIN measured at the second time following the first time. In detail, the analysis circuit 322 may determine that the defect is generated to the device under test 200 when the current IIN measured at the first time is substantially equivalent to the current IIN measured at the second time. The analysis circuit 322 may determine the device under test 200 to be normal when the current IIN measured at the first time is sufficiently different from the current IIN measured at the second time.

An operation for the test device 300 to test the device under test 200 will now be described with reference to FIG. 4 to FIG. 7. In particular, FIG. 4 shows a timing diagram of internal command signals and other signals relating to a write with auto-precharge command applied to a semiconductor memory device according to an embodiment.

Figure 4:
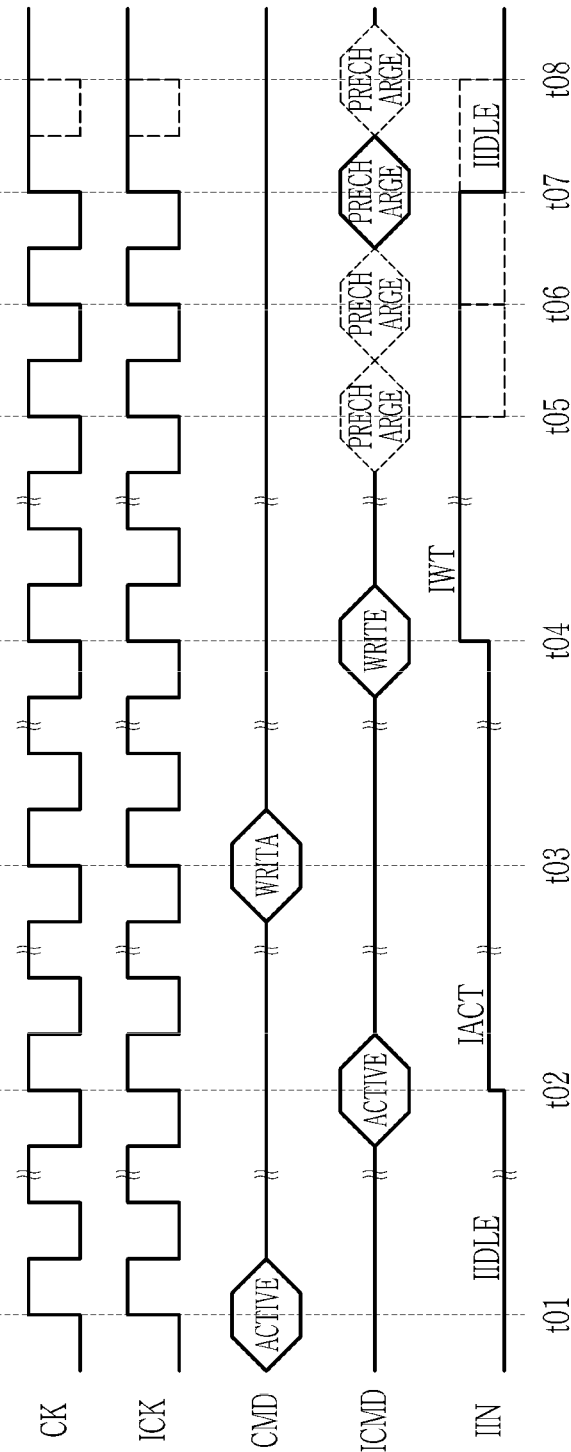
FIG. 4 shows a timing diagram of internal commands and signals relating to a write with auto-precharge command applied to a semiconductor memory device according to an embodiment.

Referring to FIG. 4, at a time point t01, the test device 300 may provide a command signal CMD including an active instruction ACTIVE. The command decoder 221 may decode the command signal CMD, and may provide the internal command signal ICMD for the address buffer 230 to output a row address RA to the address buffer 230 according to the active instruction ACTIVE at a time point t02. In the time period of t01 to t02, the input current may have a first value IIDLE. After the time point t02, the input current may have a second value IACT. The second value IACT may be different than the first value IIDLE. In some embodiments, the second value IACT may be greater than the first value IIDLE, as shown, or less than the first value.

When the internal command signal ICMD at the time point t02 is provided, the input current IIN may be changed. The input current IIN has been described to be changed at the time point t02, but the input current IIN may be changed within the time frame of a plurality of periods of the clock signal ICK from the time point t02. For example, as the driving voltage is applied to the word line by the internal command signal ICMD at the time point t02, power consumption by the device under test 200 within the time frame within a plurality of periods of the clock signal ICK from the time point t02 may increase and the input current IIN may increase to the second value IACT from the first value IIDLE. FIG. 4 shows that the input current IIN increases to the second value IACT and is then maintained, the input current IIN may increase or decrease in a peak form, and the form of the input current IIN according to the increase of power consumption in the device under test 200 is not limited to the above description.

At a time point t03, the test device 300 may provide a write-auto precharge instruction WRITA to the command signal CMD. The command decoder 221 may decode the command signal CMD, and may output the internal command signal ICMD for writing test data TDATA at a time point t04. For example, the command decoder 221 may provide the internal command signal ICMD for allowing the address buffer 230 to output the column address CA to the address buffer 230. In the time period of t03 to t04, the input current may have the second value IACT. After the time point t04, the input current may have a third value IWT. The third value IWT may be different from the first value IIDLE and/or the second value IACT.

When the internal command signal ICMD at the time point t04 is provided, the input current IIN may be changed. The input current IIN has been described to be changed at the time point t04, and the input current IIN may be changed within the time frame of a plurality of periods of the clock signal ICK from the time point t02. For example, as the write driver is activated by the internal command signal ICMD at the time point t04, power consumption of the device under test 200 may increase from the time point t04. For example, the input current IIN may increase to the third value IWT from the second value IACT. FIG. 4 shows that the input current IIN increases to the third value IWT and is then maintained for some time, and the input current IIN or decreases from the peak. However, this is merely an example and the input current IIN may increase or decrease according to the power consumption in the device under test 200.

The command decoder 221 may decode the command signal CMD, and may output the internal command signal ICMD for performing a precharge operation at a time point t07. For example, the command decoder 221 may provide the internal command signal ICMD for activating the sensing amplifier 211 corresponding to the column address indicated by the write-auto precharge instruction WRITA. The command decoder 221 is preset to receive the write-auto precharge instruction WRITA and output an internal command signal ICMD for performing a precharge operation when a predetermined period t03 to t07 (here, the predetermined period may be synchronized with the timing of the clock signal CK) passes. Differing from what is preset, the command decoder 221 may output the internal command signal ICMD for performing a precharge operation at the other time points (e.g., t05, t06, t08, etc.,) that is not the time point t07. In this case, the device under test 200 has a difficulty in satisfying a normal timing parameter.

The test device 300 may provide a command signal CMD (e.g., WRITA) for performing a plurality of operations (e.g., a write operation and a precharge operation) to the device under test 200, and may determine whether the device under test 200 is operating to satisfy the normal timing parameter. The test device 300 may determine or measure the current IIN at the time point t07 when a predetermined period t03 to t07 has elapsed after the test device 300 provides the command signal CMD (e.g., write-auto precharge command) to the device under test 200, and/or at the time point t06 before the time point t07. In an embodiment, the test device 300 may stop applying the clock signal CK and may measure the current IIN at the respective time points t06 (e.g., a first time point) and t07 (e.g., a second time point). The test device 300 may compare the current IIN determined or measured at the first time point t06 before the time point t07 when the predetermined period t03 to t07 has passed after the command signal CMD is provided to the device under test 200 and the current IIN measured at the second time point t07 when the predetermined period t03 to t07 has passed after the command signal CMD is provided to the device under test 200. The test device 300 may determine the device under test 200 to be normal when the value of the current IIN measured at the first time point t06 is different from the value of the current IIN measured at the second time point t07 when the predetermined period t03 to t07 has passed after the command signal CMD is provided to the device under test 200. On the other hand, the test device 300 may determine that the device under test 200 has a defect when the value of the current IIN measured at the first time point t06 is substantially equal to the value of the current IIN measured at the second time point t07 when the predetermined period t03 to t07 has passed after the command signal CMD is provided to the device under test 200.

When the device under test 200 outputs the internal command signal ICMD for performing a precharge operation at the time points (e.g., t05, t06, t08, etc.,) that are different from the time point t07, the current IIN measured at the first time point t06 may have the same value as the current IIN measured at the second time point t07. For example, when the internal command signal ICMD for performing a precharge operation is output at the time point t05 or the time point t06 (additionally, times prior to the time points t05 and t06), the current IIN measured at the first time point t06 and the current IIN measure at the second time point t07 may have the first value IIDLE. However, when the internal command signal ICMD for performing a precharge operation is output at the time point t08 (additionally, times after the time point t08), the current IIN measured at the first time point t06 and the current IIN measured at the second time point t07 may have the third value IWT. The test device 300 may determine that the device under test 200 has a defect when the respective currents measured at the second time point t07 and the first time point t06 are equal or substantially equal to each other. Here, a first current determined at the first time point t06 being substantially equal to a second current determined at the second time point t07 may mean that a difference between the first current and the second current is within a predetermined threshold value.

In an embodiment, the test device 300 may measure the current IIN within the period until the internal command signal for performing a write operation is output and the internal command signal ICMD for performing a precharge operation is output. The test device 300 may determine whether the device under test 200 has a defect according to whether the measured current IIN is within the reference current range. The test device 300 may set the reference current range by measuring the current IIN multiple times for the period t04 to t06 of performing a write operation to performing a precharge operation. For example, the test device 300 may measure the current IIN at the time of t05 or t06. The test device 300 may determine whether the measured current IIN is within the reference current range. The test device 300 may determine the device under test 200 to be normal when the measured current IIN is within the reference current range. The test device 300 may determine that the device under test 200 has a defect when the measured current IIN is out of the reference current range.

Figure 5:
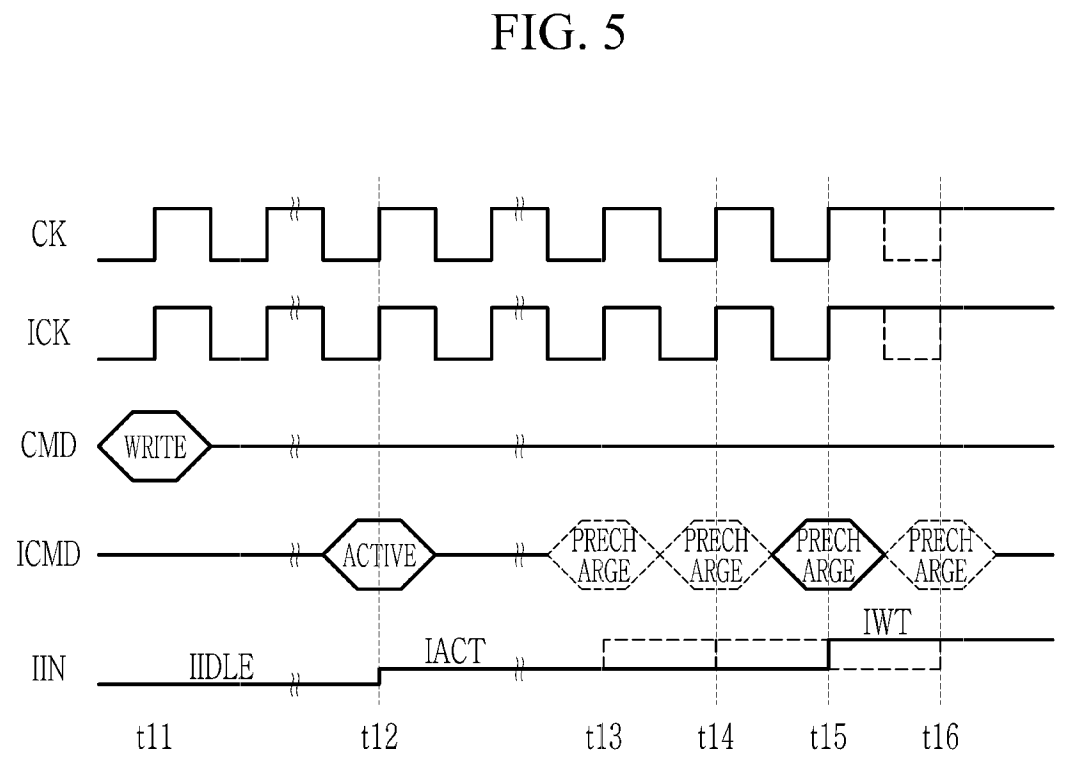

FIG. 5 shows a timing diagram of internal commands and signals relating to a write command applied to a semiconductor memory device according to an embodiment. Referring to FIG. 5, at the time of t11, the test device 300 may provide the write instruction WRITE as the command signal CMD. The command decoder 221 may decode the command signal CMD, may provide the internal command signal ICMD corresponding to the active instruction ACTIVE at the time of t12, and may provide the internal command signal ICMD corresponding to the write instruction WRITE at the time of t15. The device under test 200 may perform an operation that corresponds to the active instruction ACTIVE when the first period t11 to t12 (e.g., tRCD) passes from the time of receiving the write instruction WRITE as the command signal CMD, and it may perform the operation that corresponds to the write instruction WRITE when the second period t11 to t15 passes. For the time period of t11 to t12, the input current may have the first value IIDLE. After the time point t12, the input current may have the second value IACT. The second value IACT may be different from the first value IIDLE. The input current IIN may be changed when the internal command signal ICMD at the time of t12 is provided. The input current IIN has been described to be changed at the time of t12, and the input current IIN may be changed within the time frame of a plurality of periods of the clock signal ICK from the time of t12. For example, as the driving voltage is applied to the word line by the internal command signal ICMD at the time of t12, the power consumption by the device under test 200 may increase within the time frame of a plurality of periods of the clock signal ICK from the time of t12 so the input current IIN may increase to reach the second value IACT from the first value IIDLE. FIG. 5 shows that the input current IIN increases to reach the second value IACT and is then maintained, the input current IIN may increase or decrease in a peak form, and the form of the input current IIN according to the increase of power consumption in the device under test 200 is not limited to the above-given description.

The command decoder 221 may output the internal command signal ICMD for writing test data TDATA at the time of t13. For example, the command decoder 221 may provide the internal command signal ICMD for allowing the address buffer 230 to output a column address CA to the address buffer 230. During the time interval from t12 to t13, the input current may have the second size IACT. After the time of t13, the input current may have the third value IWT. The third value IWT may be different from the first value IIDLE and/or the second value IACT.

The input current IIN may be changed when the internal command signal ICMD at the time of t13 is provided. The input current IIN has been described to be changed at the time of t13, and the input current IIN may be changed within the time frame of a plurality of periods of the clock signal ICK from the time of t12. For example, as the write driver is activated by the internal command signal ICMD at the time of t13, the power consumption of the device under test 200 within the time frame of a plurality of periods of the clock signal ICK may increase from the time of t13, and the input current IIN may increase to the third value IWT from the second value IACT. FIG. 5 shows that the input current IIN increases to reach the third value IWT and is then maintained, the input current IIN may increase or decrease in a peak form, and the form of the input current IIN according to the increase of power consumption in the device under test 200 is not limited to the above-given description.

The command decoder 221 may be preset to receive the write instruction WRITE, and output the internal command signal ICMD for performing a write operation when a predetermined period t11 to t15 (here, the predetermined period may be synchronized with the timing of the clock signal CK) has passed. Differing from what is preset, the command decoder 221 may output the internal command signal ICMD for performing a write operation at the other times (e.g., t13, t14, t16, etc.,) that is not the time of t15. In this case, the device under test 200 has a difficulty in satisfying a normal timing parameter.

The test device 300 may provide the command signal CMD (e.g., WRITE) for performing a plurality of operations (the active operation and the write operation) to the device under test 200, and may determine whether the device under test 200 is operated to satisfy the normal timing parameter. The test device 300 may measure the current IIN at the time of t15 when a predetermined period t11 to t15 has passed after the test device 300 provides the command signal CMD to the device under test 200 and at the time of t14 that is prior to the same. In an embodiment, the test device 300 may stop applying the clock signal CK at the respective measured times t14 and t15, and may measure the current IIN. The test device 300 may compare the current IIN measured at the first time of t14 before the time of t15 when the predetermined period t11 to t15 has passed after the command signal CMD is provided to the device under test 200 and the current IIN measured at the second time of t15 when the predetermined period t11 to t15 has passed after the command signal CMD is provided to the device under test 200. The test device 300 may determine the device under test 200 to be normal when the value of the current IIN measured at the first time of t14 is different from the value of the current IIN measured at the second time of t15 when the predetermined period t11 to t15 has passed after the command signal CMD is provided to the device under test 200. The test device 300 may determine that the device under test 200 has a defect when the value of the current IIN measured at the first time of t14 is substantially equivalent to the value of the current IIN measured at the second time of t15 when the predetermined period t11 to t15 has passed after the command signal CMD is provided to the device under test 200.

When the device under test 200 outputs the internal command signal ICMD for performing a precharge operation at the times (e.g., t13, t14, t16, etc.,) that are different from the time of t15, the current IIN measured at the first time of t14 may have the same value as the current IIN measured at the second time of t15. For example, when the internal command signal ICMD for performing a precharge operation is output at the time of t13 or t14 (additionally, times prior to the time), the current IIN measured at the first time of t14 and the current IIN measure at the second time of t15 may have the same first value IIDLE. When the internal command signal ICMD for performing a precharge operation is output at the time of t16 (additionally, times after the time), the current IIN measured at the first time of t14 and the current IIN measured at the second time t15 may have the third value IWT. The test device 300 may determine that the device under test 200 has a defect when the currents measured at the second time of t15 when the predetermined period t11 to t15 has passed after the command signal CMD is provided to the device under test 200 and at the first time of t14 when the clock signal CK is transitioned to the high level before the second time are equivalent to each other.

In an embodiment, the test device 300 may measure the current IIN within the period until outputting the internal command signal ICMD for performing a write operation after outputting the internal command signal for performing an active operation. The test device 300 may determine whether the device under test 200 has a defect according to whether the measured current IIN is within the reference current range. The test device 300 may set the reference current range by measuring the current IIN multiple times for the period t12 to t15 of performing an active operation to performing a write operation. For example, the test device 300 may measure the current IIN at the time of t13 or t14. The test device 300 may determine whether the measured current IIN is within the reference current range. The test device 300 may determine the device under test 200 to be normal when the measured current IIN is within the reference current range. The test device 300 may determine that the device under test 200 has a defect when the measured current IIN is out of the reference current range.

Figure 6:
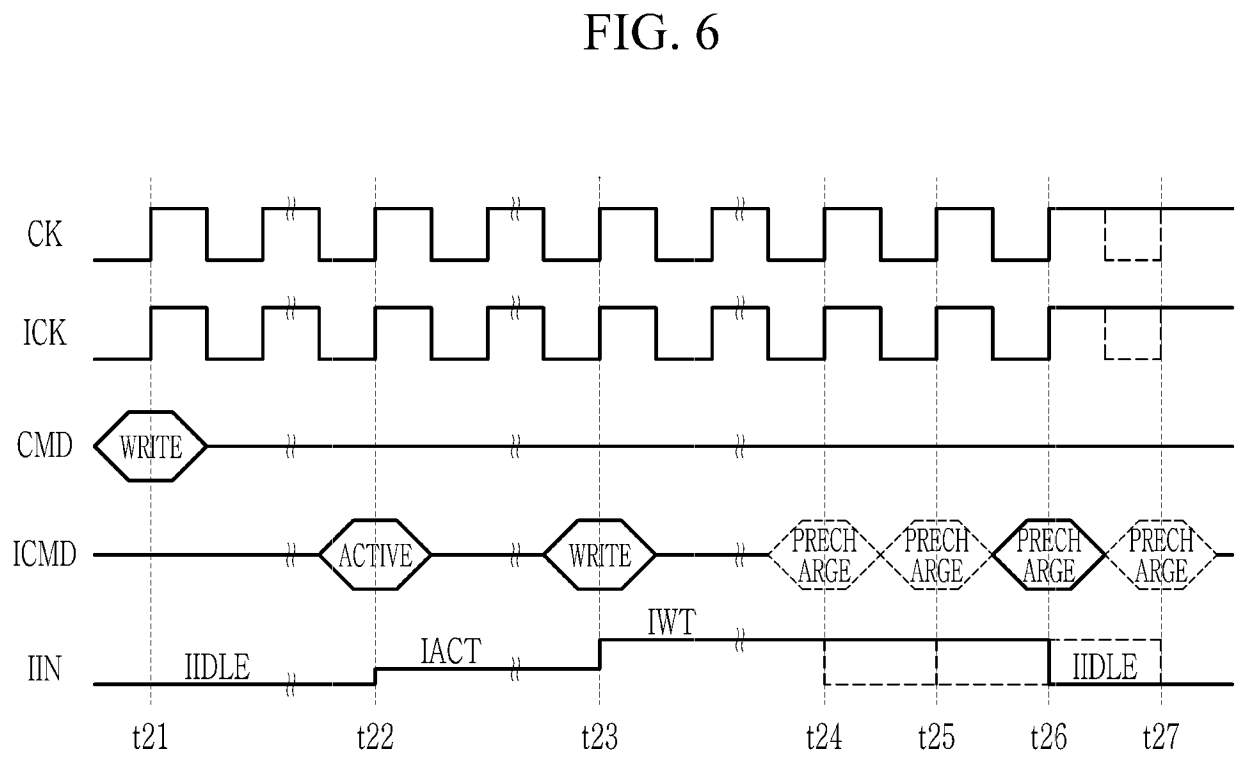
Figure 7:
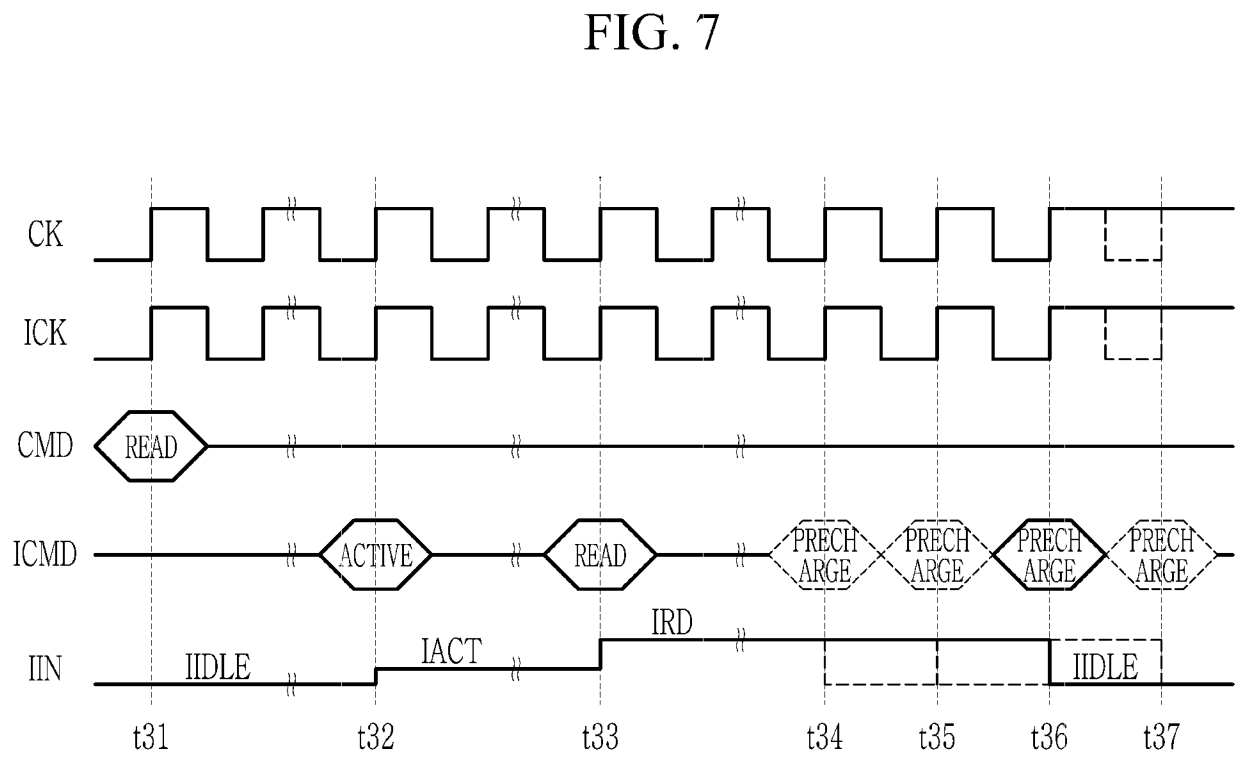

FIG. 6 shows a timing diagram of internal commands and signals relating to a write command applied to a semiconductor memory device according to an embodiment, and FIG. 7 shows a timing diagram of internal commands and signals relating to a read command applied to a semiconductor memory device according to an embodiment. Portions of FIG. 6 and FIG. 7 that are similar or equivalent to what is described with reference to FIG. 5 will be omitted.

Referring to FIG. 6, at the time of t21, the test device 300 may provide the write instruction WRITE as the command signal CMD. The command decoder 221 may decode the command signal CMD, may provide the internal command signal ICMD that corresponds to the active instruction ACTIVE at the time of t22, may provide the internal command signal ICMD that corresponds to the write instruction WRITE at the time of t23, and may provide the internal command signal ICM that corresponds to the precharge instruction PRECHARGE at the time of t26. The command decoder 221 may be preset to receive the write instruction WRITE, and output the internal command signal ICMD for performing a precharge operation when a predetermined period t21 to t26 (e.g., tRC) (here, the predetermined period may be synchronized with the timing of the clock signal CK) has passed. Differing from what is preset, the command decoder 221 may output the internal command signal ICMD for performing a precharge operation at the other times (e.g., t24, t25, t27, etc.,) that are not the time of t26. In this case, the device under test 200 has a difficulty in satisfying a normal timing parameter.

The test device 300 may provide a command signal CMD (e.g., WRITE) for performing a plurality of operations (the active operation, the write operation, and the precharge operation) to the device under test 200, and may determine whether the device under test 200 is operated to satisfy the normal timing parameter. The test device 300 may measure the current IIN at the time of t26 when a predetermined period t21 to t26 has passed after the test device 300 provides the command signal CMD to the device under test 200, and at the time of t25 before the time. In an embodiment, the test device 300 may stop applying the clock signal CK and may measure the current IIN at the respective measuring times t25 and t26. The test device 300 may compare the current IIN measured at the first time of t25 before the time of t26 when the predetermined period t21 to t26 has passed after the command signal CMD is provided to the device under test 200 and the current IIN measured at the second time of t26 when the predetermined period t21 to t26 has passed after the command signal CMD is provided to the device under test 200. The test device 300 may determine the device under test 200 to be normal when the value of the current IIN measured at the first time of t25 is different from the value of the current IIN measured at the second time of t26 when the predetermined period t21 to t26 has passed after the command signal CMD is provided to the device under test 200. The test device 300 may determine that the device under test 200 has a defect when the value of the current IIN measured at the first time of t25 is substantially equivalent to the value of the current IIN measured at the second time of t26 when the predetermined period t21 to t26 has passed after the command signal CMD is provided to the device under test 200.

When the device under test 200 outputs the internal command signal ICMD for performing a precharge operation at the times (e.g., t24, t25, t27, etc.,) that are different from the time of t26, the current IIN measured at the first time of t25 may have the same value as the current IIN measured at the second time of t26. For example, when the internal command signal ICMD for performing a precharge operation is output at the time of t24 or t25 (additionally, times prior to the time), the current IIN measured at the first time of t25 and the current IIN measure at the second time of t26 may have the first value IIDLE. When the internal command signal ICMD for performing a precharge operation is output at the time of t27 (additionally, times after the time), the current IIN measured at the first time of t25 and the current IIN measured at the second time t26 may have the third value IWT. The test device 300 may determine that the device under test 200 has a defect when the currents measured at the second time of t26, when the predetermined period t21 to t26 has passed after the command signal CMD is provided to the device under test 200, and at the first time of t25, when the clock signal CK is transitioned to the high level before the second time, are equal or substantially equal to each other.

In an embodiment, the test device 300 may measure the current IIN within the period until the internal command signal for performing a write operation is output and the internal command signal ICMD for performing a precharge operation is output. The test device 300 may determine whether the device under test 200 has a defect according to whether the measured current IIN is within the reference current range. The test device 300 may set the reference current range by measuring the current IIN multiple times for the period t23 to t25 of performing a write operation to performing a precharge operation. For example, the test device 300 may measure the current IIN at the time of t24 or t25. The test device 300 may determine whether the measured current IIN is within the reference current range. The test device 300 may determine the device under test 200 to be normal when the measured current IIN is within the reference current range. The test device 300 may determine that the device under test 200 has a defect when the measured current IIN is out of the reference current range.

Referring to FIG. 7, at the time of t31, the test device 300 may provide the read instruction READ as the command signal CMD. The command decoder 221 may decode the command signal CMD, may provide the internal command signal ICMD that corresponds to the active instruction ACTIVE at the time of t32, may provide the internal command signal ICMD that corresponds to the read instruction READ at the time of t33, and may provide the internal command signal ICM that corresponds to the precharge instruction PRECHARGE at the time of t36. The command decoder 221 may be preset to receive the read instruction READ, and output the internal command signal ICMD for performing a precharge operation when a predetermined period t31 to t36 (here, the predetermined period may be synchronized with the timing of the clock signal CK) has passed. Differing from what is preset, the command decoder 221 may output the internal command signal ICMD for performing a precharge operation at the other times (e.g., t34, t35, t37, etc.,) that is not the time of t36. In this case, the device under test 200 can have difficulty in satisfying a normal timing parameter.

The test device 300 may provide a command signal CMD (e.g., READ) for performing a plurality of operations (the active operation, the read operation, and the precharge operation) to the device under test 200, and may determine whether the device under test 200 is operated to satisfy the normal timing parameter. The test device 300 may measure the current IIN at the time of t36 when a predetermined period t31 to t36 has passed after the test device 300 provides the command signal CMD to the device under test 200, and at the time of t35 before the time. In an embodiment, the test device 300 may stop applying the clock signal CK and may measure the current IIN at the respective measuring times t35 and t36. The test device 300 may compare the current IIN measured at the first time of t35 before the time of t36 when the predetermined period t31 to t36 has passed after the command signal CMD is provided to the device under test 200 and the current IIN measured at the second time of t36 when the predetermined period t31 to t36 has passed after the command signal CMD is provided to the device under test 200. The test device 300 may determine the device under test 200 to be normal when the value of the current IIN measured at the first time of t35 is different from the value of the current IIN measured at the second time of t36 when the predetermined period t31 to t36 has passed after the command signal CMD is provided to the device under test 200. The test device 300 may determine that the device under test 200 has a defect when the value of the current IIN measured at the first time of t35 is substantially equivalent to the value of the current IIN measured at the second time of t36 when the predetermined period t31 to t36 has passed after the command signal CMD is provided to the device under test 200.

When the device under test 200 outputs the internal command signal ICMD for performing a precharge operation at the times (e.g., t34, t35, t37, etc.,) that are different from the time of t36, the current IIN measured at the first time of t35 may have the same value as the current IIN measured at the second time of t36. For example, when the internal command signal ICMD for performing a precharge operation is output at the time of t34 or t35 (additionally, times prior to the time), the current IIN measured at the first time of t35 and the current IIN measure at the second time of t36 may have the first value IIDLE. When the internal command signal ICMD for performing a precharge operation is output at the time of t37 (additionally, times after the time), the current IIN measured at the first time of t35 and the current IIN measured at the second time t36 may have a fourth value IRD. The test device 300 may determine that the device under test 200 has a defect when the currents measured at the second time of t36 when the predetermined period t31 to t36 has passed after the command signal CMD is provided to the device under test 200 and at the first time of t35 when the clock signal CK is transitioned to the high level before the second time are equivalent to each other.

In an embodiment, the test device 300 may measure the current IIN within the period until the internal command signal for performing a write operation is output and the internal command signal ICMD for performing a precharge operation is output. The test device 300 may determine whether the device under test 200 has a defect according to whether the measured current IIN is within the reference current range. The test device 300 may set the reference current range by measuring the current IIN multiple times for the period t33 to t35 of performing a write operation to performing a precharge operation. For example, the test device 300 may measure the current IIN at the time of t34 or t35. The test device 300 may determine whether the measured current IIN is within the reference current range. The test device 300 may determine the device under test 200 to be normal when the measured current IIN is within the reference current range. The test device 300 may determine that the device under test 200 has a defect when the measured current IIN is out of the reference current range. According to an embodiment, when the command signals of the SRAM interface such as the write instruction WRITE and the read instruction READ are provided to the DRAM, it may be detected whether the internal commands (AC-TIVE, WRITE, READ, PRECHARGE, etc.,) are generated in the DRAM at appropriate timing. That is, according to the embodiment, when the command signal for instructing a plurality of operations to be performed at predetermined timing is applied to the semiconductor memory device, it may be easily detected whether the semiconductor memory device normally performs the operations at the predetermined timing.

Figure 8:
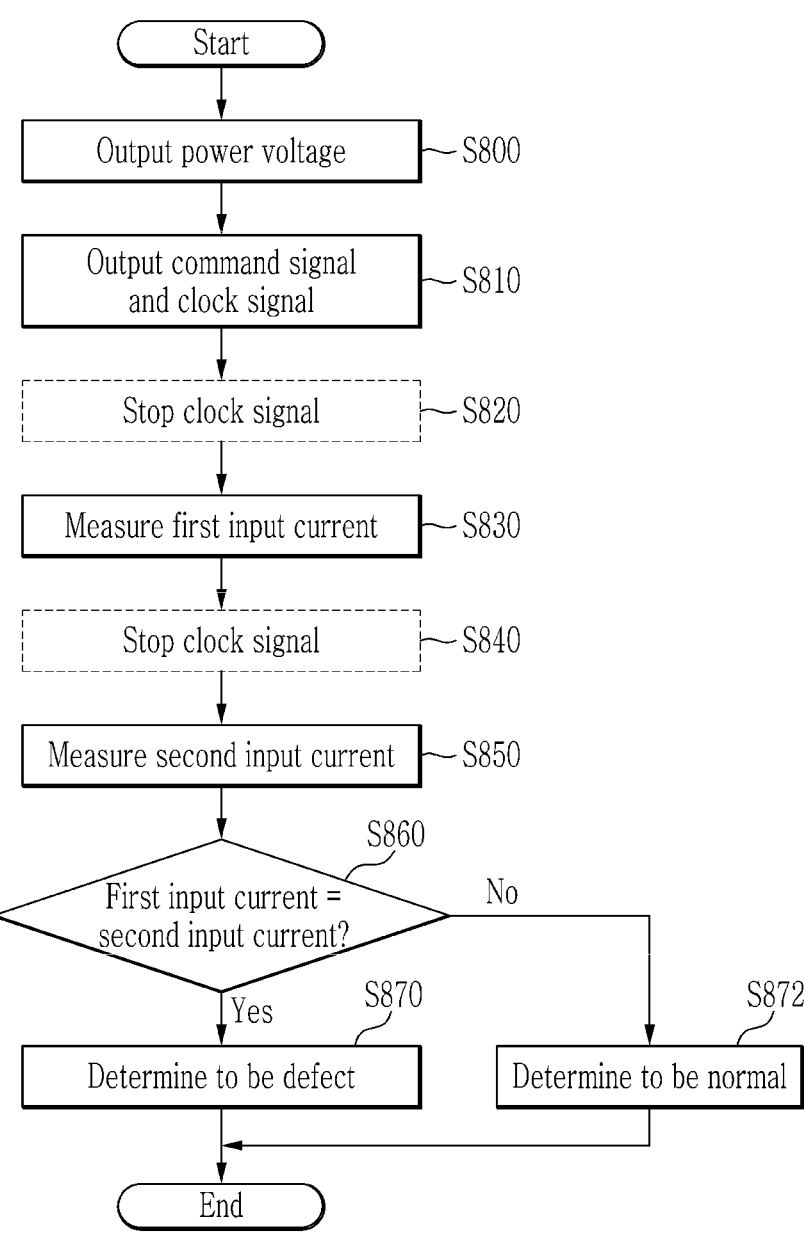
FIG. 8 shows a flowchart of a testing method according to an embodiment.

FIG. 8 shows a flowchart of a testing method according to an embodiment. Referring to FIG. 8, the test device provides a power source voltage VDD to the device under test (S800). The device under test may generate a driving voltage for performing various operations by using the power source voltage VDD. The test device may also output a command signal and a clock signal to the device under test (S810). The command signal may include an instruction for instructing a plurality of operations to be performed at the predetermined timing.

Next, the test device stops the clock signal (S820). In particular, the test device may stop the clock signal to measure the input current flowing to the device under test. The timing when the test device stops the clock signal may be the first time when a predetermined period has passed after the command signal is provided to the device under test. The stage of S820 may be performed prior to the stage of S830 because the time for measuring the input current is greater than one period of the clock signal. However, when the time for measuring the input current is equal to or less than the one period of the clock signal, the stage of S820 may be omitted.

Next, the test device measures a first input current (S830). The test device may measure the input current flowing to the device under test at the first time as the first input current. The test device may average the input currents flowing to the device under test at the first time and may use the same as the first input current by performing the stages of S800 to S830 multiple times.

The test device stops the clock signal (S840). The test device may stop the clock signal to measure the input current flowing to the device under test. The timing when the test device stops the clock signal may be the second time when a predetermined period has passed after the command signal is provided to the device under test. The stage of S840 may be performed prior to the stage of S850 because the time for measuring the input current is greater than one period of the clock signal. However, when the time for measuring the input current is equal to or less than the one period of the clock signal, the stage of S840 may be omitted.

Following this, the test device measures a second input current (S850). The test device may measure the input current flowing to the device under test at the second time as the second input current. The test device may average the input currents flowing to the device under test at the second time and may use the same as the second input current by performing the stages of S800, S810, S840, and S850 or the stages of S800, S810, S830, and S850 multiple times.

The test device determines whether a size (or a value) of the first input current is equal to a size (or a value) of the second input current (S860). When the size of the first input current is equal to the size of the second input current, the test device determines that the device under test has a defect (S870). When the size of the first input current is different from the size of the second input current, the test device determines the device under test to be normal (S872).

Figure 9:
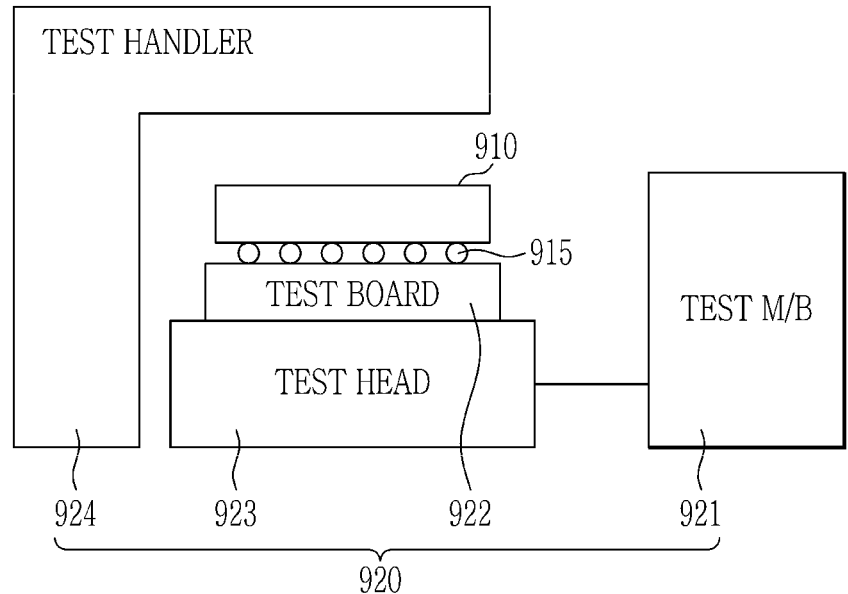
FIG. 9 shows a block diagram of a test system according to an embodiment.

FIG. 9 shows a block diagram of a test system according to an embodiment. Referring to FIG. 9, the test system 900 may include a device under test 910 and a test device 920. The test device 920 may include a test main body 921, a test board 922, a test head 923, and a test handler 924. The test device 920 tests the device under test 910, and it may be referred to as auto test equipment (ATE) from the functional viewpoint depending on embodiments.

The test main body 921 may generate a testing signal for testing the device under test 910, and may transmit the same to the test head 923. The testing signal may include a command signal, a clock signal, an address, and a test pattern signal. The test main body 921 may include a power supply and may supply a power source voltage to the test head 923. The test main body 921 may measure the input current flowing to the device under test 910. As described with reference to FIG. 1 to FIG. 8, the test main body 921 may provide a testing signal including a command signal, may measure changes of an input current when a plurality of operations are performed according to the command signal, and may detect whether the device under test 910 has a defect. The test main body 921 may include a chiller and may adjust a temperature of the test device 920. The test main body 921 may include a space for storing the device under test 910 that is a test target. Depending on embodiments, a portion including a power supply or a chiller may be referred to as a test main body, and a processing element for generating a testing signal and analyzing a test result may be a server and may be connected to the test main body.

The test main body 921 may receive a test result on the device under test 910 from the test head 923 and may analyze the same. The test main body 921 may include a processing element of an arbitrary type. For example, the test main body 921 may include a personal computer (PC), a desktop, portable electronic element, a microprocessor, a microprocessor-based or programmable user electronic element, a minicomputer, a mainframe computer, and/or a personal mobile computing element.

The test head 923 may be electrically connected to the test target through a test board 922. The test target may, for example, be a device under test 910. The test target of the test device 920 is not limited to the device under test 910. For example, a general package using no multi-channel, or a wafer-level semiconductor chip, may correspond to the test target of the test device 920. The test head 923 may transmit the testing signal provided from the test main body 921 to the device under test 910 through the test board 922. The test head 923 may also transmit the test result on the device under test 910 provided through the test board 922 to the test main body 921.

The test board 922 may be disposed on the test head 923, and the device under test 910 that is a test target may be disposed on the test board 922. The device under test 910 may be electrically connected to the test board 922 through an external access member 915. The test board 922 may correspond to an interface board for electrically connecting the device under test 910 as a test head 923. In detail, the test board 922 may be a PCB on which wires for electrically connecting the test head 923 and the device under test 910 are arranged. The wires may include input and output test signal lines, clock signal lines, and power voltage lines. According to an embodiment, not the test board 922 but a high fix (high fidelity tester access fixture, so called a mother board) may be disposed on the test head 923. The test board 922 may include a socket and a field programmable gate array (FPGA). An external access member 150 of the device under test 910 may be connected to respective pins of the socket. The FPGA is disposed to improve a function of the test device 920 having low performance, and may perform substantially the equivalent function of a BIST. For example, the FPGA may extend a system channel as a built out self test (BOST) chip, and may include a drive, a comparator, and a power channel control block.

The test handler 924 may automatically supply the test target, that is, the device under test 910, to the test board 922, and when the test process ends, it may transfer the device under test 910 to an appropriate position according to the test result. The test handler 924 may be combined to the test main body 921 by 1:1 or m:1 (m is a positive number). In other words, one test handler may be provided for each test main body 921, or a plurality of test handlers may be given for each the test main body 921. In general, the test handler 924 may be configured with a loader, an input stage, a test site, a shuttle, an unloader, an output stage, and sensors.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A test device comprising:
a power supply circuit including a power voltage pin, said power supply circuit configured to supply an input voltage through the power voltage pin to a memory device under test;
a current sensor configured to measure a current flowing to the memory device through the power voltage pin:
a clock driver configured to provide a clock signal to the memory device through a clock pin; and
a test controller configured to: transmit a command signal to the memory device, measure a first current flowing to the memory device through the power voltage pin a first period of the clock signal after transmitting the command signal, measure a second current flowing to the memory device through the power voltage pin in a second period of the clock signal, which is different from the first period of the clock signal, and determine whether the memory device is operating to satisfy a normal timing parameter based on the measured first current and the measured second current.

2. The device of claim 1, wherein the test controller is configured to identify the memory device as having a defect when a difference between the measured first current and the measured second current is less than a predetermined threshold.

3. The device of claim 1, wherein the first period of the clock signal corresponds to when the memory device performs a first operation according to the command signal; and wherein the second period of the clock signal corresponds to when the memory device performs a second operation according to the command signal, which is different from the first operation.

4. The device of claim 1, wherein the first period of the clock signal is before the memory device performs a second operation according to the command signal; and wherein the second period of the clock signal is after the memory device commences performing the second operation according to the command signal.

5. The device of claim 1, wherein the test controller measures the first current and the second current using the current sensor.

6. The device of claim 5, wherein the test controller is configured to stop applying the clock signal in the first period of the clock signal and the current sensor measures the first current while the clock signal is stopped; and
wherein the test controller is further configured to stop applying the clock signal in the second period of the clock signal, and the current sensor measures the second current while the clock signal is stopped.

7. The device of claim 3, wherein the command signal is a write auto-precharge instruction, the first operation is a write operation, and the second operation is a precharge operation.

8. The device of claim 3, wherein the command signal is a write instruction, and the first operation is an active operation and the second operation is a write operation, or the first operation is the write operation and the second operation is a precharge operation.

9. The device of claim 1, wherein the command signal is a command signal that is compatible with an SRAM interface.

10. A method of testing a memory device, comprising:
supplying an input voltage through a power voltage pin to the memory device;
transmitting a clock signal to the memory device;
transmitting a command signal to the memory device;

measuring, using a current sensor, a first current flowing through the power voltage pin to the memory device, in a first period of the clock signal subsequent to transmission of the command signal; then measuring, using the current sensor, a second current flowing through the power voltage pin to the memory device, in a second period of the clock signal subsequent to the first period of the clock signal and determining whether the memory device has a defect based on the first current and the second current.

11. The method of claim 10, wherein determining whether the memory device has a defect further comprises:

determining that the memory device has a defect when a difference between the measured first current and the measured second current is less than a predetermined threshold;

determining that the memory device is without the defect when the difference between the measured first current and the measured second current is greater than the predetermined threshold.

12. The method of claim 10, wherein the memory device is performing a first operation according to the command signal in the first period of the clock signal; and wherein the memory device is performing a second operation according to the command signal, which is different than the first operation, in the second period of the clock signal.

13. The method of claim 10, wherein the first period of the clock signal is before the memory device performs a second operation according to the command signal; and wherein the second period of the clock signal is after the memory device commences performing the second operation according to the command signal.

14. The method of claim 10, wherein the measuring the first current further comprises measuring the first current when the clock signal is not applied in the first period of the clock signal, and wherein the measuring the second current further comprises measuring the second current when the clock signal is not applied.

15. The method of claim 12, wherein the command signal is a write auto-precharge instruction, the first operation is a write operation, and the second operation is a precharge operation.

16. The method of claim 12, wherein the command signal is a write instruction, and wherein the first operation is an active operation and the second operation is a write operation, or the first operation is the write operation and the second operation is a precharge operation.

17. The method of claim 11, wherein the first period and the second period occur before the memory device performs a second operation after performing a first operation according to the command signal.

18. A test system, comprising:

a device under test (DUT) including a semiconductor memory device having a core circuit therein; and a test device configured to: (i) supply an input voltage to the DUT, (ii) generate a command signal that causes the DUT to perform a first operation using first circuitry within the core circuit within the DUT, and a second operation using second circuitry within the core circuit within the DUT, (iii) transmit the command signal to the memory device, (iv) measure, using a current sensor, a current flowing to the DUT as a first current when performing the first operation, (v) measure, using the current sensor, a current flowing to the DUT as a second current when performing the second operation, and (vi) determine whether the DUT is operating to satisfy a normal timing parameter based on the first current and the second current; and wherein the first circuitry is not identical to the second circuitry.

* * * * *